US009622347B2

United States Patent
Oi et al.

(10) Patent No.: US 9,622,347 B2
(45) Date of Patent: Apr. 11, 2017

(54) WIRING SUBSTRATE, SEMICONDUCTOR DEVICE, METHOD OF MANUFACTURING WIRING SUBSTRATE, AND METHOD OF MANUFACTURING SEMICONDUCTOR DEVICE

(71) Applicant: SHINKO ELECTRIC INDUSTRIES CO., LTD., Nagano-shi (JP)

(72) Inventors: Kiyoshi Oi, Nagano (JP); Takashi Kurihara, Nagano (JP)

(73) Assignee: SHINKO ELECTRIC INDUSTRIES CO., LTD., Nagano-shi (JP)

( * ) Notice: Subject to any disclaimer, the term of this patent is extended or adjusted under 35 U.S.C. 154(b) by 188 days.

(21) Appl. No.: 14/561,540

(22) Filed: Dec. 5, 2014

(65) Prior Publication Data

US 2015/0223330 A1   Aug. 6, 2015

(30) Foreign Application Priority Data

Feb. 5, 2014   (JP) .................................. 2014-019980

(51) Int. Cl.
| | | |
|---|---|---|
| *H05K 1/18* | (2006.01) | |
| *H05K 1/11* | (2006.01) | |
| *H05K 3/46* | (2006.01) | |
| *H05K 7/12* | (2006.01) | |
| *H05K 7/00* | (2006.01) | |
| *H05K 3/34* | (2006.01) | |

(52) U.S. Cl.
CPC ........... *H05K 1/113* (2013.01); *H05K 3/4661* (2013.01); *H05K 3/3436* (2013.01); *H05K 2201/096* (2013.01); *H05K 2201/09472* (2013.01); *H05K 2201/10674* (2013.01)

(58) Field of Classification Search
CPC .......... H05K 2201/09436; H05K 2201/09445; H05K 2201/09454; H05K 2201/09463; H05K 2201/09472; H05K 2201/09481; H05K 2201/0949; H05K 2201/095; H05K 2201/09509; H05K 2201/09518; H05K 2201/09527; H05K 2201/09545; H05K 2201/09645
USPC ............... 361/750, 761, 762, 764, 767, 783; 174/549, 262
See application file for complete search history.

(56) References Cited

U.S. PATENT DOCUMENTS

| 2001/0042637 A1 | 11/2001 | Hirose |
|---|---|---|
| 2004/0025333 A1 | 2/2004 | Hirose |

(Continued)

FOREIGN PATENT DOCUMENTS

| JP | 2000-244125 | 9/2000 |
|---|---|---|
| JP | 2008-112987 A1 | 5/2008 |
| JP | 2009-277916 A1 | 11/2009 |

*Primary Examiner* — Binh Tran
(74) *Attorney, Agent, or Firm* — Kratz, Quintos & Hanson, LLP

(57) ABSTRACT

A wiring substrate includes a first multi-layer wiring layer having a stacked via structure including a first electrode pad, a second multi-layer wiring layer having a non-stacked via structure including a second electrode pad. The second electrode pad is formed on an uppermost first insulating layer. The first electrode pad is formed on a second insulating layer which is located to a position lower by one layer than the first insulating layer, and the first electrode pad is arranged in an opening portion of the first insulating layer such that the upper face and the side face of the first electrode pad are exposed.

4 Claims, 13 Drawing Sheets

(56) References Cited

U.S. PATENT DOCUMENTS

| | | | |
|---|---|---|---|
| 2005/0067715 A1* | 3/2005 | Sunohara | H01L 21/563 257/778 |
| 2008/0083560 A1 | 4/2008 | Saiki | |
| 2008/0173473 A1 | 7/2008 | Hirose | |
| 2008/0189943 A1 | 8/2008 | Hirose | |
| 2009/0284943 A1 | 11/2009 | Yoda | |
| 2010/0140800 A1* | 6/2010 | Hagihara | H01L 21/563 257/737 |

* cited by examiner

WIRING SUBSTRATE, SEMICONDUCTOR DEVICE, METHOD OF MANUFACTURING WIRING SUBSTRATE, AND METHOD OF MANUFACTURING SEMICONDUCTOR DEVICE

CROSS-REFERENCE TO RELATED APPLICATIONS

This application is based upon and claims the benefit of priority of the prior Japanese Patent Application No. 2014-019980, filed on Feb. 5, 2014, the entire contents of which are incorporated herein by reference.

FIELD

This invention is related to a wiring substrate, a semiconductor device, a method of manufacturing a wiring substrate, and a method of manufacturing a semiconductor device.

BACKGROUND ART

In recent years, with the advancement in the performance of semiconductor device of the higher density of the mounting technology has been advanced. The flip-chip connection has been widely used as a technique to connect a semiconductor chip to a wiring substrate. In the flip-chip connection, the bump electrodes of the semiconductor chip are connected to the electrodes of the wiring substrate through the solder.

A related art is disclosed in Japanese Laid-open Patent Publication No. 2000-244125, Japanese Laid-open Patent Publication No, 2008-112987, and Japanese Laid-open Patent Publication No. 2009-277916.

SUMMARY

As will be explained in the section of preliminary matter given below, in a wiring substrate having multi-layer stacked via structure, there is a problem that when the thermal stress or the like is generated, the stress concentrates at the lowermost part of the stacked via structure, thus via destruction is generated easily.

According to one aspect discussed herein, there is provided a wiring substrate, including a first multi-layer wiring layer having a stacked via structure including a first electrode pad, a second multi-layer wiring layer having a non-stacked via structure including a second electrode pad, in which the second electrode pad is formed on an uppermost first insulating layer, and the first electrode pad is formed on a second insulating layer which is located to a position lower by one layer than the first insulating layer, and the first electrode pad is arranged in an opening portion of the first insulating layer such that an upper face and a side face of the first electrode pad are exposed.

Also, according to another aspect discussed herein, there is provided a method of manufacturing a wiring substrate, including arranging a via pad on a first insulating layer in a stacked via forming region and arranging a first wiring layer on the first insulating layer in a stacked via not-forming region, forming a second insulating layer on the first insulating layer, the second insulating layer in which a first via hole is arranged on the via pad and a second via hole is arranged on the first wiring layer, forming a second wiring layer connected to the first wiring layer through the second via hole, in a state that the via pad is exposed in the first via hole, forming a third insulating layer on the second insulating layer, the third insulating layer in which a first opening portion is arranged in an area containing the first via hole, and a third via hole is arranged on the second wiring layer, and forming a first electrode pad connected to the via pad through the first via hole, on the second insulating layer in the first opening portion of the third insulating layer such that an upper face and a side face of the first electrode pad are exposed, and also forming a second electrode pad connected to the second wiring layer through the third via hole on the third insulating layer.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

DESCRIPTION OF EMBODIMENT

Hereinbelow, an embodiment will be explained with reference to the accompanying drawings.

Figure 1:
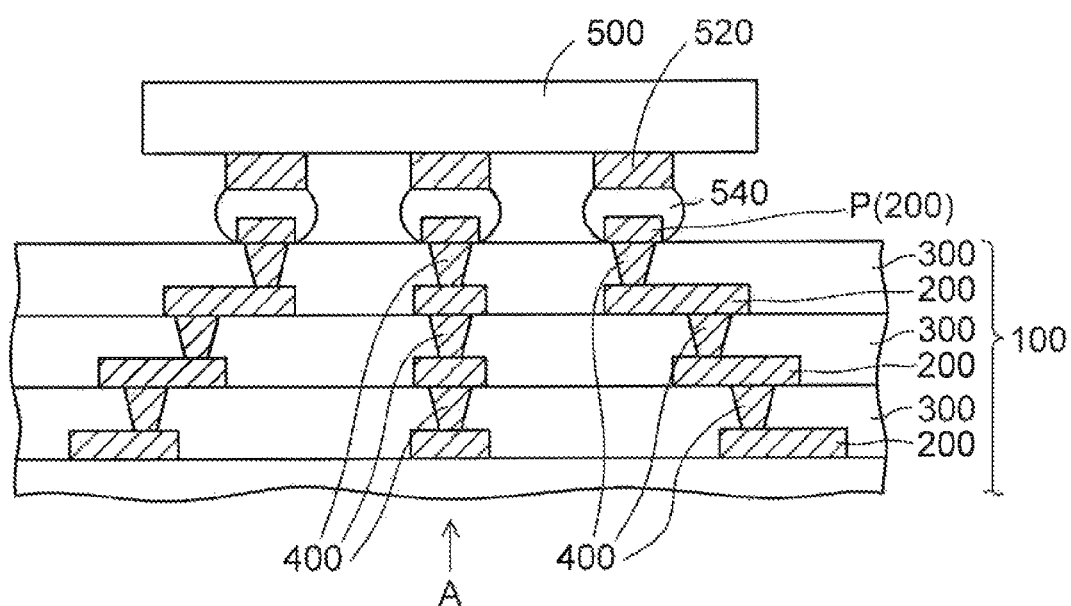
FIG. 1 is a cross-sectional view depicting a state that a semiconductor chip is flip-chip connected to a wiring substrate according to a preliminary matter (part 1).
Figure 2:
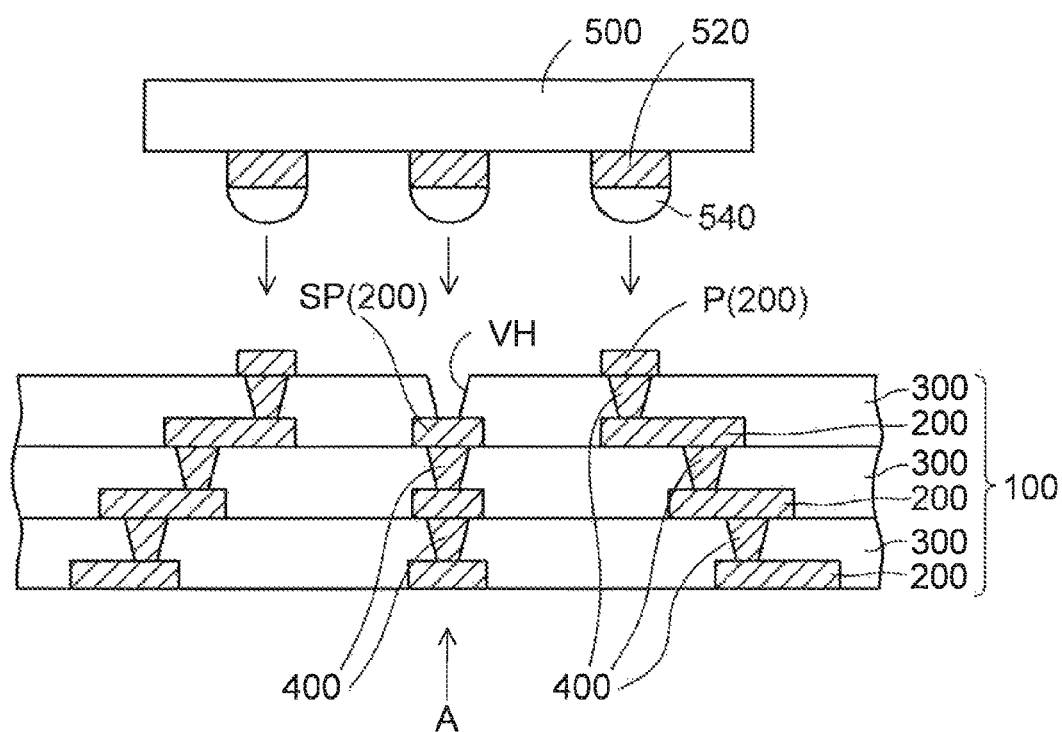
FIG. 2 is a cross-sectional view depicting a state that a semiconductor chip is flip-chip connected to a wiring substrate according to the preliminary matter (part 2).

Prior to the explanation of the embodiment, the preliminary matter to be set forth as a basis will be explained hereunder. FIG. 1 and FIG. 2 are views each depicting a state that a semiconductor chip is flip-chip connected to a wiring substrate according to the preliminary matter.

As depicted in FIG. 1, in a wiring substrate 100 according to the preliminary matter, wiring layers 200 of four-layers as multi-layer wirings are stacked on each inter layer insulating layer 300 respectively, and are stacked. The wiring layers 200 of the four-layers are connected each other by via conductors 400 formed in the interlayer insulating layers 300. The uppermost wiring layer 200 on the wiring substrate 100 is formed as electrode pads P.

Then, bump electrodes 520 of a semiconductor chip 500 are flip-chip connected to the electrode pads P of the wiring substrate 100 through a solder layer 540.

In recent years, with the advancement in the performance of the semiconductor chip 500, the narrower pitch of the bump electrodes 520 has been advanced. For this reason, the higher density of the wirings of the wiring substrate 100 has been regained. In order to realize such a high-density wiring design, a stacked via structure has been employed in which vias are stacked toward the vertical direction.

In FIG. 1, the three via conductors 400 in a stacked via forming region indicated by A are stacked toward the vertical direction and electrically connected each other, thereby a stacked via structure is constituted.

Particularly in a case of a fine stacked via structure, when the thermal stress is generated by a heat process, the stress concentrates at the lowermost part of the stacked, via structure, thus the via destruction is generated easily. This leads to a problem that the reliability of the electrical connection cannot be ensured. Such a defect tends to occur easily as the stack number of stacked vias increases.

For this reason, as depicted in FIG. 2, the countermeasure is considered, in which the uppermost via conductor 400 and electrode pad P in the stacked via forming region A are omitted and the stack number of stacked layers is reduced, and the third wiring layer 200 exposed in a via hole VH is used as an electrode pad SP in the stacked via forming region A.

However, the uppermost electrode pad P has such a structure that the upper face and the side face thereof are exposed from the interlayer insulating layer 300, on the other hand, the electrode pad SP in the stacked via forming region A has such a structure that the side face and the periphery of the upper face are coated with the interlayer insulating layer 300, and only a center part of the upper face is exposed.

In this way, in this method, the structures related to the connection are different between the uppermost electrode pads P and the electrode pad SP in the stacked via forming region A.

For this reason, if the semiconductor chip 500 is flip-chip connected by adjusting the amount of the solder layer 54 of the semiconductor chip 500 side so as to adapt to the connection of the uppermost electrode pads P, the reliability of the connection to the electrode pad SP in the stacked via forming region A cannot be ensured. Particularly when the depth of the via hole VH is deep, the connection with the electrode pad SP in the stacked via forming region A will be difficult.

Also conversely, if the amount of the solder layer 54 of the semiconductor chip 500 side is excessively increased to so as to adapt to the connection to the electrode pad SP in the stacked via forming region A, short circuit is generated easily between the electrodes, thus it cannot respond to the narrower pitch.

In addition, since the solder layer is formed by electroplating or printing, it is difficult to separately adjust the amount of the solder layer at the tip of each bump electrode 520 of the semiconductor chip 500 so as to adapt to the uppermost electrode pads P and the electrode pad SP in the stacked via forming region A.

A wiring substrate and a manufacturing method thereof of the embodiment to be explained below can ensure the reliability of the electrical connection to the semiconductor chip, even if the stack number is reduced at the part of the stacked via structure.

Embodiment

Figure 3:
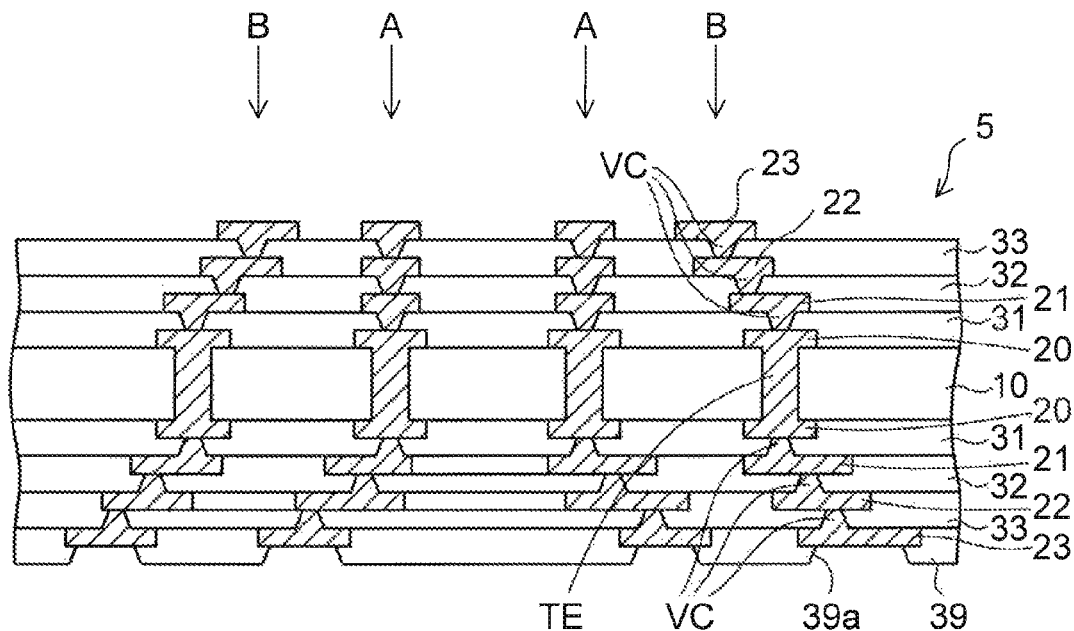
FIG. 3 is a cross-sectional view depicting a base wiring substrate used in a wiring substrate of an embodiment.
Figure 10:
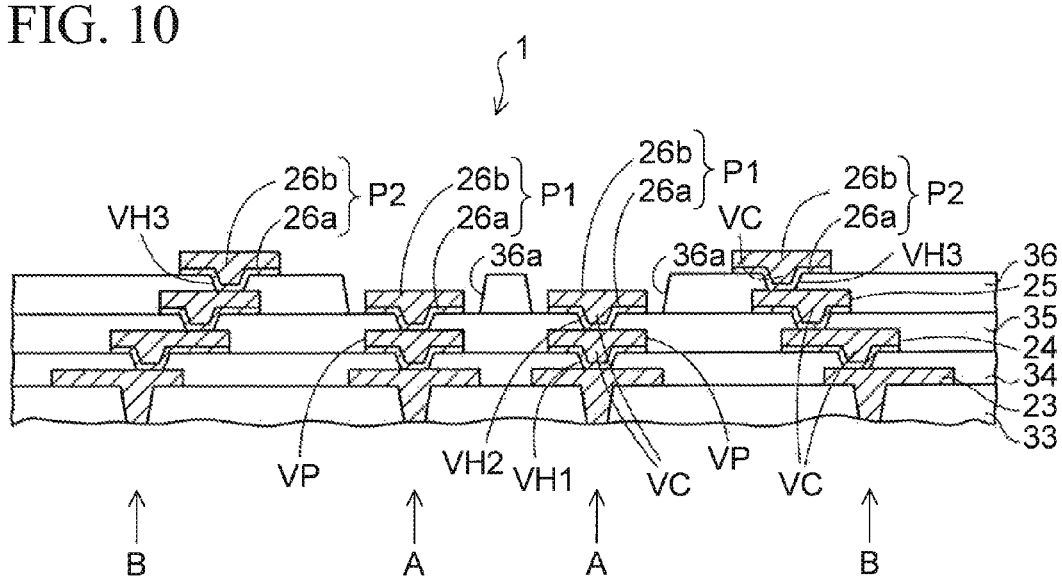
FIG. 10 is a cross-sectional view depicting a wiring substrate of the embodiment (part 1).
Figure 11:
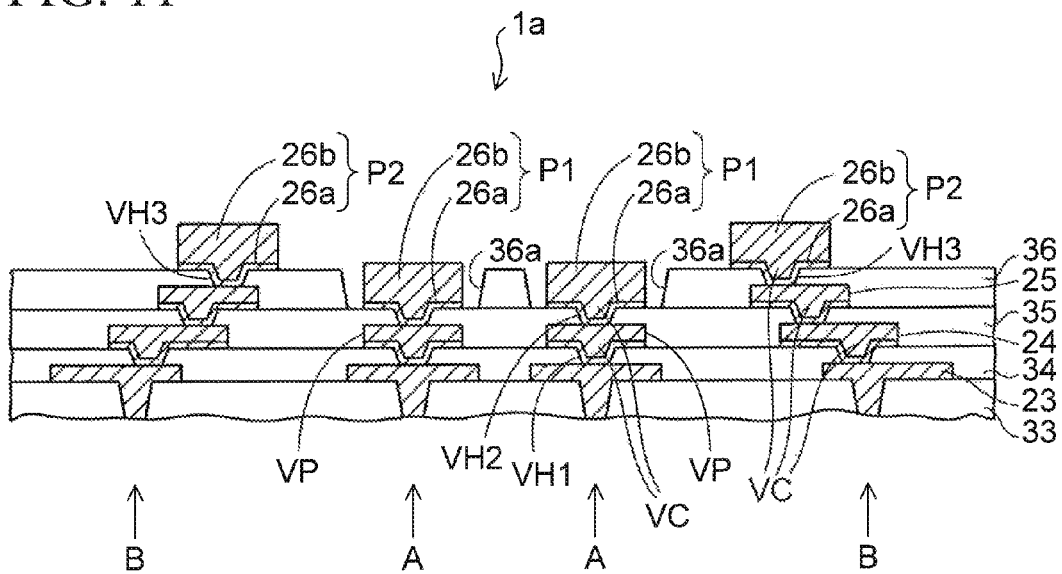
FIG. 11 is a cross-sectional view depicting a wiring substrate of the embodiment (part 2).

FIG. 3 is a cross-sectional view depicting a base wiring substrate used in a wiring substrate of an embodiment. FIG. 4A to FIG. 9C are cross-sectional views depicting a method of manufacturing a wiring substrate of the embodiment. FIG. 10 and FIG. 11 are cross-sectional views each depicting a wiring substrate of the embodiment.

In the method of manufacturing a wiring substrate of the embodiment, as depicted in FIG. 3, first, a base wiring substrate 5 is prepared which serves as an underlying member for forming the structure of the wiring substrate of the embodiment. The base wiring substrate 5 includes a core substrate 10 in a center part in the thickness direction.

A wiring layer 20 is formed on both faces of the core substrate 10. Penetrating electrodes TE are formed in the core substrate 10, which penetrates in the thickness direction, and the wiring layers 20 on both faces are connected each other through the penetrating electrodes TE.

Wiring layers 21, 22, 23 of three-layers are stacked as multi-layer wirings on both face sides of the core substrate 10. The wiring layers 21, 22, 23 of the three-layers are connected to the wiring layers 20 and formed on respective insulating layers 31, 32, 33 respectively. The wiring layers 21, 22, 23 of the three-layers are connected each other by via conductors VC formed in the respective insulating layers 31, 32, 33. A solder resist layer 39 is formed on the lowermost insulating layer 33 on the lower face side, and the solder resist layer 39 in which opening portions 39a are provided on connection parts of the wiring layer 23.

On the upper face side of the core substrate 10 of the base wiring substrate 5 in FIG. 3, a multi-layer wiring layer having a stacked via structure is formed in each of regions indicated by A, and a multi-layer wiring layer having a non-stacked via structure is formed in each of regions indicated by B.

Hereinbelow, fine multi-layer wirings are formed as rewiring layers on the wiring layer 23 on the upper face side of the base wiring substrate 5 in FIG. 3, thereby the method of manufacturing a wiring substrate and the structure of a wiring substrate of the embodiment will be explained.

Figure 4A:
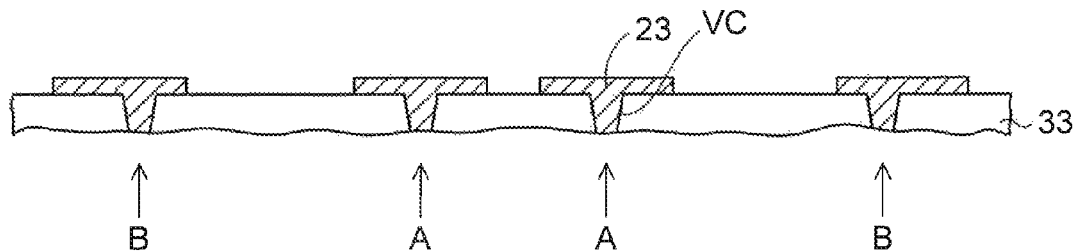
FIGS. 4A to 4D are cross-sectional views depicting a method of manufacturing a wiring substrate of the embodiment (part 1).

In the manufacturing method of the wiring substrate explained below, the wiring layer 23 on the upper face side of the base wiring substrate 5 in FIG. 3 is partially depicted and is explained. FIG. 4A is a cross-sectional view depicting to image partially the wiring layer 23 on the upper face side of the base wiring substrate 5 in FIG. 3.

So as to correspond to the base wiring substrate 3 in FIG. 3, regions indicated by A in FIG. 4A become stacked via forming regions, and regions indicated by B in FIG. 4A become stacked via not-forming regions.

Figure 4B:
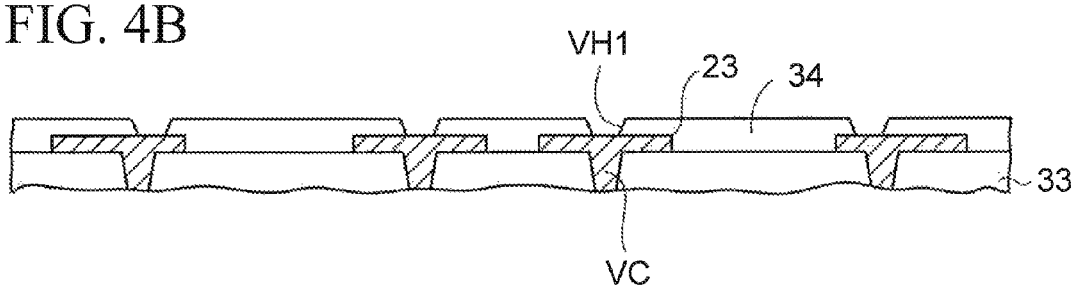

Then, as depicted in FIG. 4B, a photosensitive resin (not depicted) is formed on the insulating layer 33 in FIG. 4A, and exposed and developed by photolithography, and then cured by a heat process.

By this matter, an insulating layer 34 is formed in which via holes VH1 are arranged on the wiring layer 23. By using a photosensitive resin containing no inorganic filler, such as silica or the like, a thin insulating layer 34 can be formed to be made to the pattern. The thickness of the insulating layer 34 is set within a range of 1 μm to 5 μm and preferably of 2 μm to 3 μm.

As one preferred example of the insulating layer 34, a permanent resist layer formed of a phenol-based resin having photosensitivity is used. The resin may be formed by attaching an uncured resin sheet or by coating a liquid resin. In the case of the formation of the other insulating layers to be mentioned below, similar resin materials and formation methods are employed.

Figure 4C:
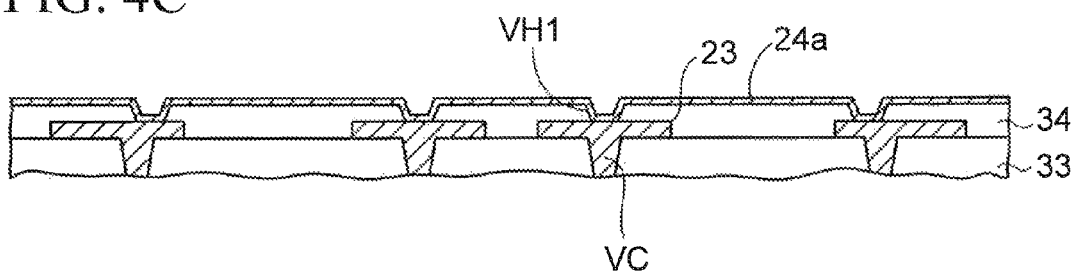

Then, as depicted in FIG. 4C, a seed layer 24a is formed on the insulating layer 34 and on the inner face of each via hole VH1 by sputtering or electroless plating. As one example of the seed layer 24a, a titanium (Ti) layer having a thickness of 0.05 μm and a copper (Cu) layer having a thickness of 0.5 μm are formed in this order from the lower side.

Figure 4D:
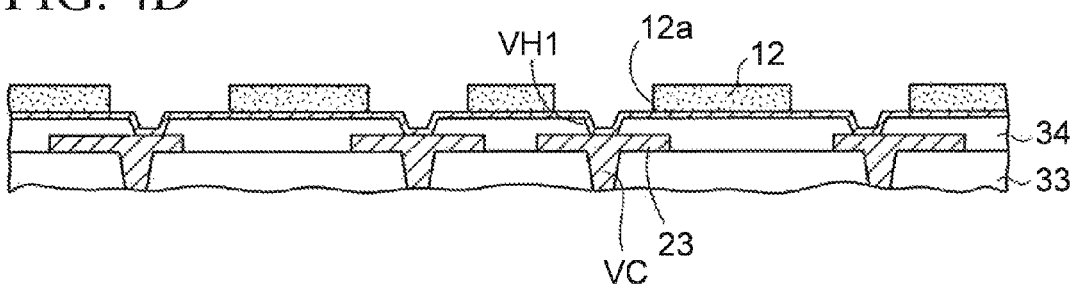

Thereafter, as depicted in FIG. 4D, a plating resist layer 12 is formed on the basis of the photolithography on the seed layer 24a, the plating resist layer 12 in which opening portions 12a are provided in areas where a wiring layer is to be arranged.

Figure 5A:
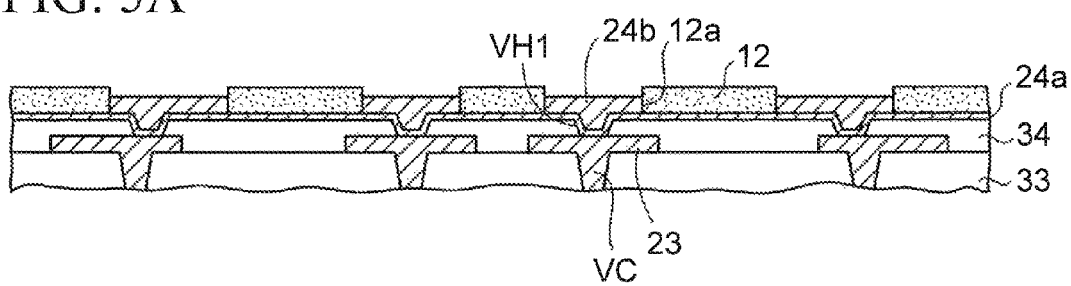
FIGS. 5A to 5C are cross-sectional views depicting the method of manufacturing a wiring substrate of the embodiment (part 2).
Figure 5B:
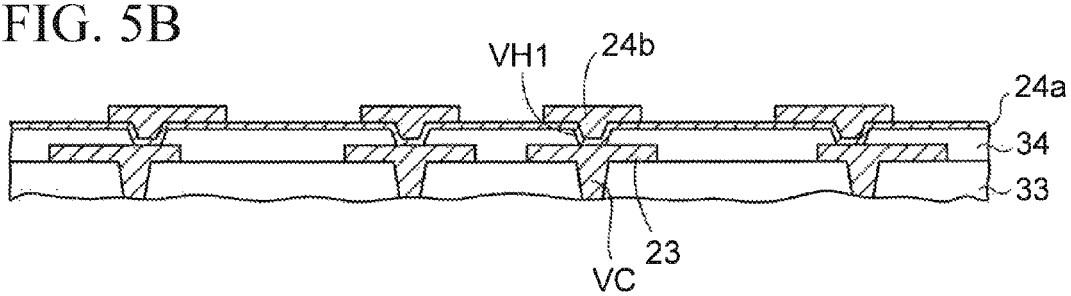

Then, as depicted in FIG. 5A, a copper (Cu) plating layer 24b is formed in the opening portions 12a of the plating resist layer 12 by electroplating utilizing the seed layer 24a as a plating power feeding path.

Thereafter, as depicted in FIG. 53, the plating resist layer 12 is removed to expose the seed layer 24a.

Figure 5C:
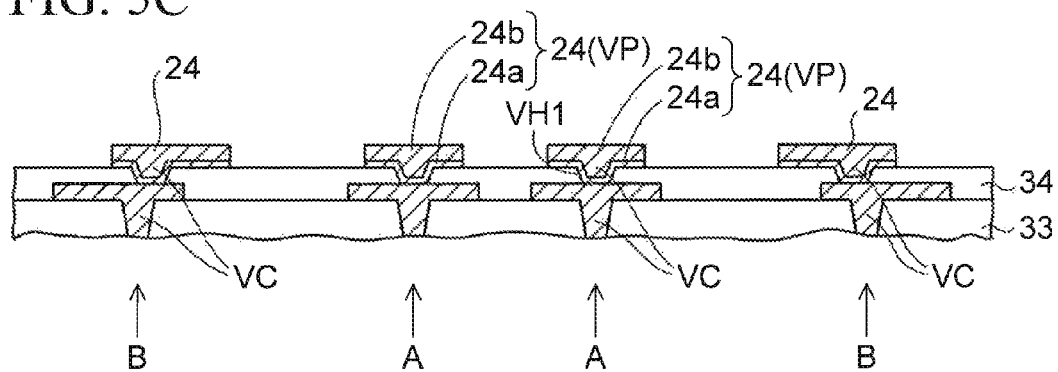

Further, as depicted in FIG. 5C, the seed layer 24a is removed by wet etching while using the copper plating layer 24b as a mask. By this matter, a wiring layer 24 is formed from the seed layer 24a and the copper plating layer 24b. The wiring layer 24 is connected to the lower wiring layer 23 through a via conductor VC in the via hole VH1.

In this way, since the wiring layer 24 is formed by a semi-additive method which can form fine wirings, the wiring layer 24 can be formed in a finer pattern than the wiring layer 23 located to the lower side. Wiring layers which are to be formed on and above the wiring layer 24 in the following steps are formed by the semi-additive method as well.

In the stacked via forming regions A in the center part in FIG. 5C, the wiring layer 24 is formed as a via pad VP for forming the stacked via structure, and two via conductors VC located to upper and lower sides are stacked toward a vertical direction.

Moreover, in the stacked via not-forming regions B on the both end parts in FIG. 5C, two via conductors VC located to upper and lower sides are arranged to deviate each other, thereby a multi-layer wiring having a non-stacked via structure is constituted.

In this way, the via pad VP is arranged in the stacked via forming region A, and the wiring layer 24 is arranged in the stacked via not-forming region B.

Figure 6A:
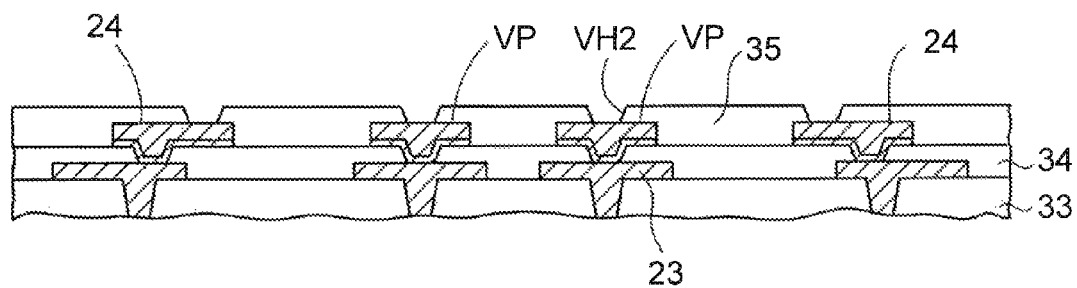
FIGS. 6A to 6C are cross-sectional views depicting the method of manufacturing a wiring substrate of the embodiment (part 3).

Then, as depicted in FIG. 6A, by a method similar to the method of forming the insulating layer 34 in FIG. 4A mentioned above, an insulating layer 35 is formed on the insulating layer 34, the insulating layer 35 in which via holes VH2 are arranged on the wiring layer 24 and the via pads VP.

Figure 6B:
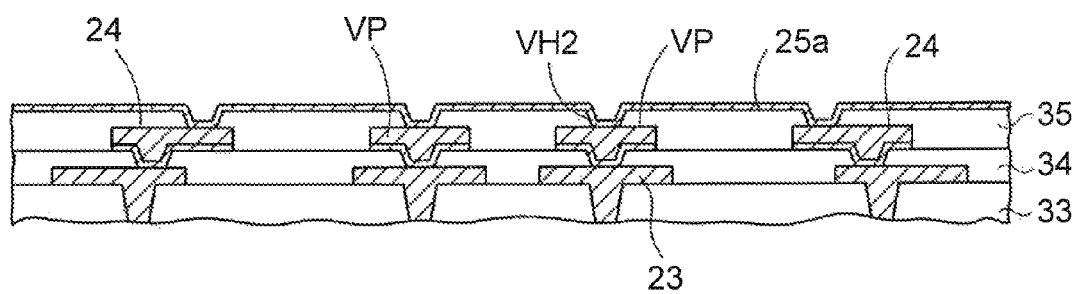
Figure 6C:
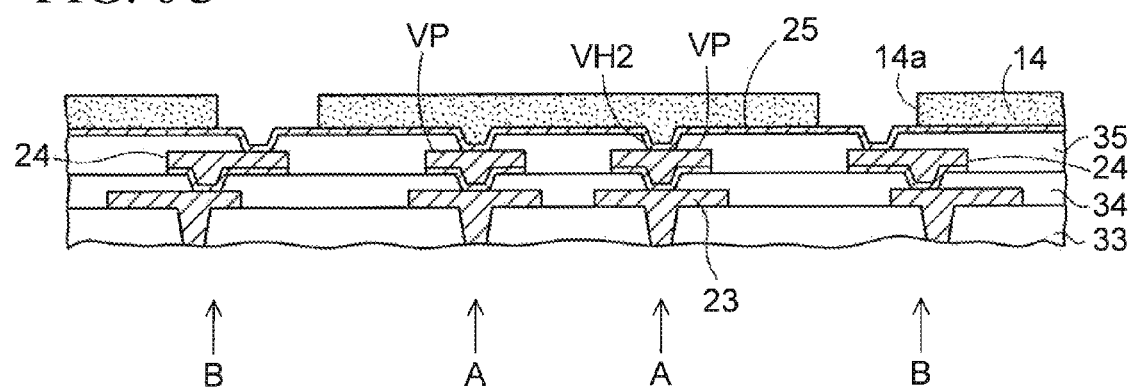

Further, as depicted in FIG. 6B, by a method similar to the step in FIG. 4B mentioned above, a seed layer 25a is formed on the insulating layer 35 and on the inner face of each via hole VH2. Thereafter, as depicted in FIG. 6C, a plating resist layer 14 is formed on the seed layer 25a, the plating resist layer 14 in which opening portions 14a are provided in the parts where the wiring layers in the stacked via not-forming regions B are to be arranged.

Figure 7A:
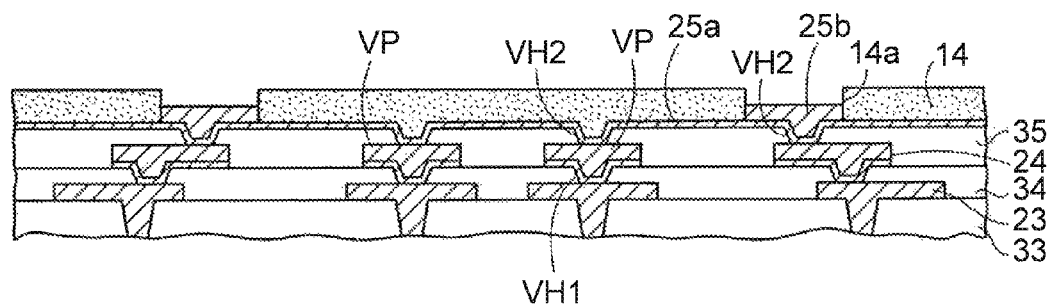
FIGS. 7A to 7C are cross-sectional views depicting the method of manufacturing a wiring substrate of the embodiment (part 4).

Then, as depicted in FIG. 7A, a copper plating layer 25b is formed in the opening portion 14a of the plating resist layer 14 by electroplating utilizing the seed layer 25a as a plating power feeding path.

Figure 7B:
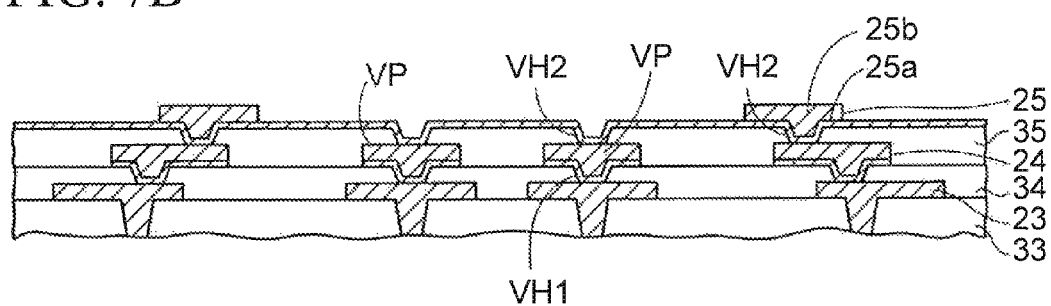

Thereafter, as depicted in FIG. 7B, the plating resist layer 14 is removed to expose the seed layer 25a.

Figure 7C:
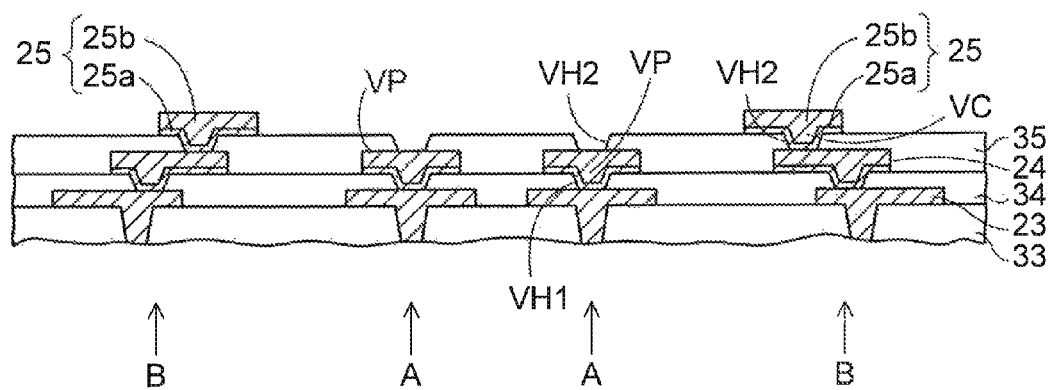

Then, as depicted in FIG. 7C, the seed layer 25a is removed by wet etching while using the copper plating layer 25b as a mask. By this matter, a wiring layer 25 is formed in the stacked via not-forming region B from the seed layer 25a and the copper plating layer 25b. The wiring layer 25 is connected to the wiring layer 24 located to the lower side through a via conductor VC in the via hole VH2.

Here, in the stacked via forming region A, no wiring layer (via pad) to be connected to the via pad VP located to the lower side is formed, and the seed layer 25a in the via hole VH2 is removed. Thus, it is in a state that the via pad VP is exposed at the bottom of the via hole VH2. By this matter, it means that the stack number of the vias in the stacked via structure is reduced by 1.

The wiring layer 25 is formed as a thin film having a thickness within a range of 1 μm to 5 μm and preferably of 2 μm to 3 μm, so that the level difference between the stacked via forming regions A and the stacked via not-forming regions B can be small.

Figure 8A:
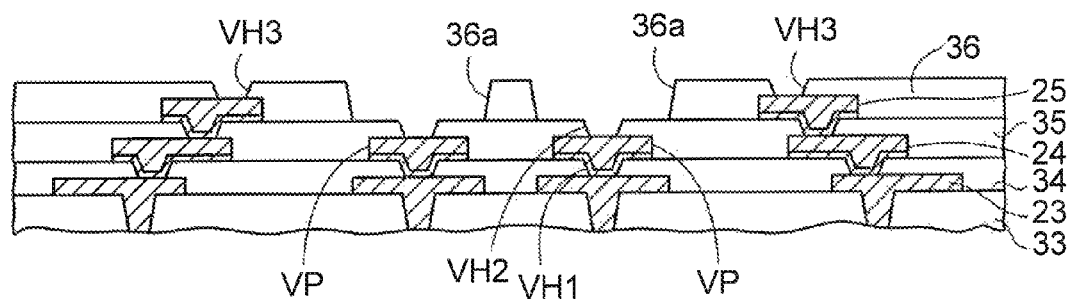
FIGS. 8A to 8C are cross-sectional views depicting the method of manufacturing a wiring substrate of the embodiment (part 5).

Then, as depicted in FIG. 8A, by a method similar to the method of forming the insulating layer 34 in FIG. 4A mentioned above, an insulating layer 36 is formed on the insulating layer 35 to be made to the pattern. The insulating layer 36 is formed to include opening portions 36a in areas containing the via holes VH2 on the via pads VP, and also include via holes VH3 on the wiring layer 25.

As will be explained in the step to be given below, electrode pads to be connected to the via pads VP are formed in the opening portions 36a of the insulating layer 36 such that the upper faces and the side faces of the electrode pads are exposed. For this reason, the size of the opening portions 36a of the insulating layer 36 is set one size larger than the size of the electrode pads.

The insulating layer 36 is formed of a thin film having a thickness within a range of 1 μm to 5 μm and preferably of 2 μm to 3 μm as well, so that the level difference between the stacked via forming regions A and the stacked via not-forming regions B can be small.

As mentioned above, the insulating layer 36 which is a thin film can be formed by using a photosensitive resin containing no inorganic filler.

Figure 8B:
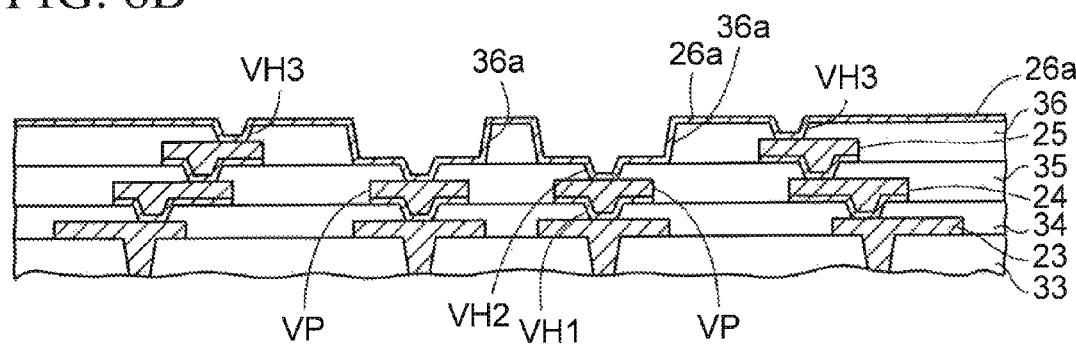
Figure 8C:
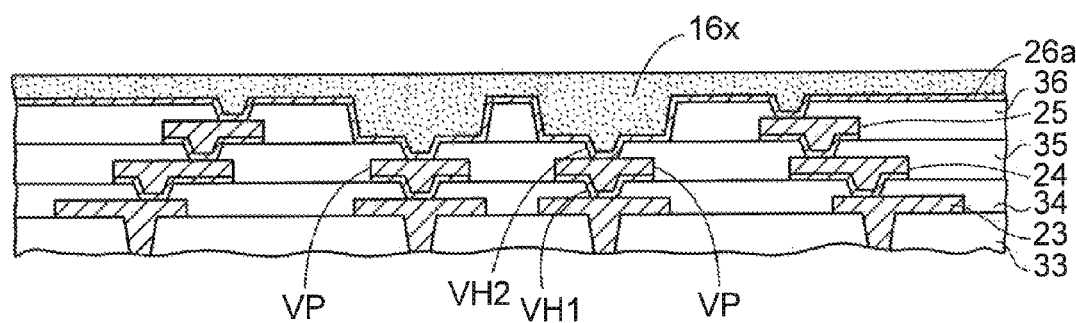

Thereafter, as depicted in FIG. 8B, by a method similar to the step in FIG. 4C mentioned above, a seed layer 26a is formed on the insulating layer 36 and on the inner faces of the via holes VH2, VH3 and the opening portions 36a.

Then, as depicted in FIG. 3C, a resist material 16x is formed on the entire upper face of the seed layer 26a of the structure in FIG. 8B, and exposed and developed on the basis of the photolithography.

Figure 9A:
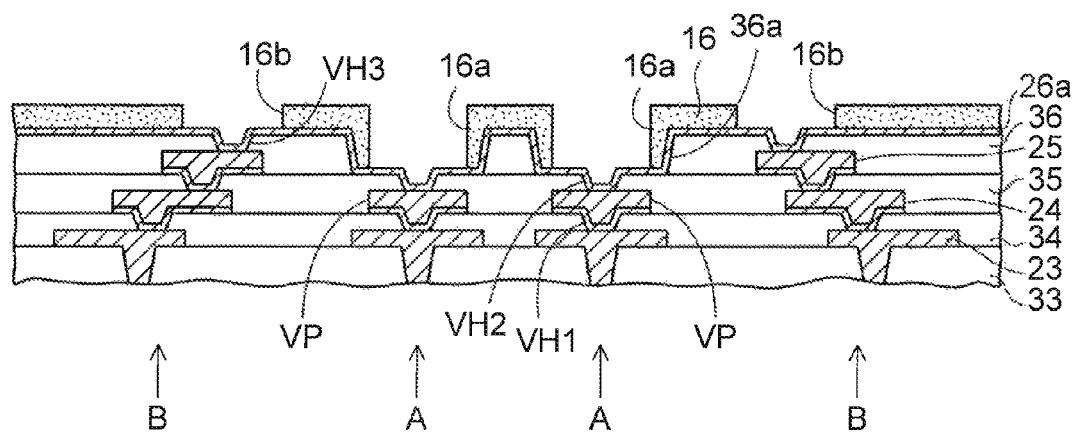
FIGS. 9A to 9C are cross-sectional views depicting the method of manufacturing a wiring substrate of the embodiment (part 6).

By this matter, as depicted in FIG. 9A, a plating resist layer 16 made to the pattern is formed on the seed layer 26a.

In the plating resist layer 16 in the stacked via forming regions A, opening portions 16a which is smaller than the opening portions 36a of the insulating layer 36, are arranged in the opening portions 36a of the insulating layer 36, the opening portions 16a which is communicated with the via hole VH2. Moreover, in the plating resist layer 16 in the stacked via not-forming regions B, opening portions 16b are arranged in areas containing the via holes VH3.

Figure 9B:
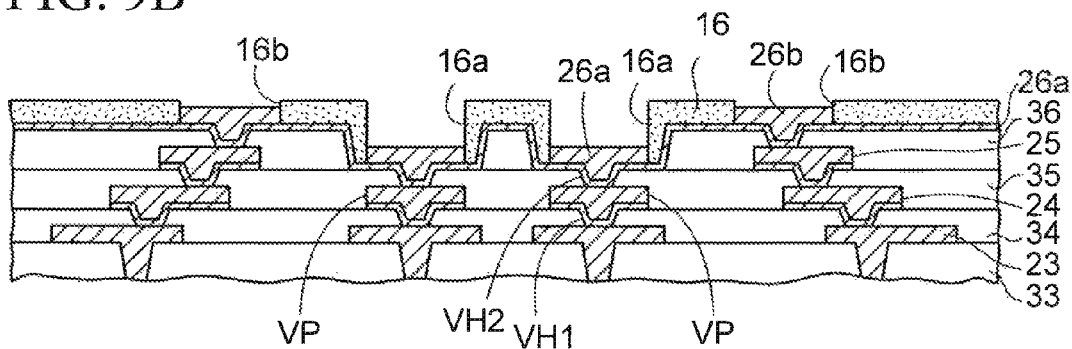

Then, as depicted in FIG. 9B, a copper plating layer 26b is formed in the opening portions 16a, 16b of the plating resist layer 16 by electroplating utilizing the seed layer 26a as a plating power feeding path.

Figure 9C:
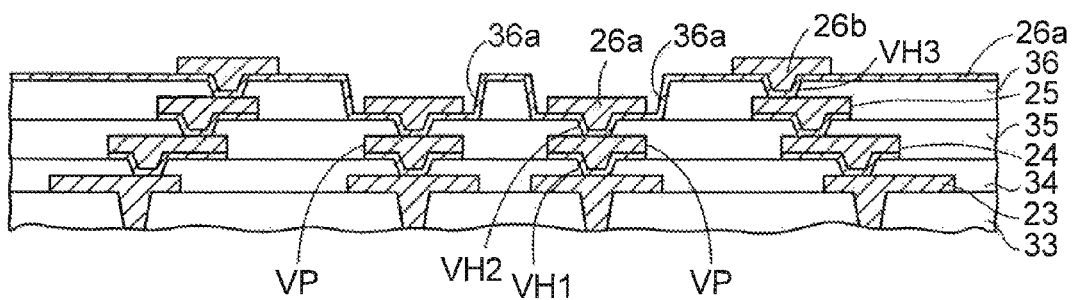

Thereafter, as depicted in FIG. 9C, the plating resist layer 16 is removed to expose the seed layer 26a.

Further, as depicted in FIG. 10, the seed layer 26a is removed by wet etching while using the copper plating layer 26b as a mask. By this matter, a first electrode pad P1 is formed in the stacked via forming region A and connected to the via pad VP through the via conductor VC in the via hole VH2.

Also at the same time, a second electrode pad P2 is formed in the stacked, via not-forming region B and connected to the wiring layer 26 through the via conductor VC in the via hole VH3. The first electrode pad P1 and the second electrode pad P2 are formed from the seed layer 26a and the copper plating layer 25b respectively. The first electrode pad P1 and the second electrode pad P2 are each formed in a circular shape in a plan view and has a diameter of 20 μm to 40 μm, for example.

By the above steps, a wiring substrate 1 of the embodiment is obtained.

As depicted in FIG. 10, in the wiring substrate 1 of this embodiment, the insulating layer 34 is formed on the uppermost insulating layer 33 and wiring layer 23 of the base wiring substrate 5 in FIG. 3 mentioned above. The via holes VH1 are formed in the insulating layer 34 and reach the wiring layer 23.

In the stacked via forming region A, the wiring substrate 1 of the embodiment includes a first multi-layer wiring layer (wiring layers 23, 24) having a stacked via structure including the first electrode pad P1 at the uppermost position. Further, in the stacked via not-forming region B, the wiring substrate 1 includes a second multi-layer wiring layer (wiring layers 23, 24, 25) having a non-stacked via structure including the second electrode pad P2 at the uppermost position.

First, the wiring layer of the first-layer on the wiring layer 23 of the base wiring substrate 5 will be explained. In the stacked via forming region A, the via pad VP is formed on the insulating layer 34 and connected to the wiring layer 23 through the via conductor VC in the via hole VH1. The via pad VP is a pad for forming the stacked via structure.

On the other hand, in the stacked via not-forming region B, the wiring layer 24 is formed on the insulating layer 34 and connected to the wiring layer 23 through the via conductor VC in the via hole VH1.

Further, in the entire region or the stacked via forming regions A and the stacked via not-forming regions B, the insulating layer 35 is formed on the insulating layer 34, the insulating layer 35 in which the via holes VH2 are arranged on the connection parts of the wiring layer 24 and the via pads VP.

Next, the wiring layer of the second-layer on the wiring layer 23 of the base wiring substrate 5 will be explained. In the stacked via forming region A, the first electrode pad P1 is formed on the insulating layer 35 and connected to the via pad VP through the via conductor VC in the via hole VH2.

On the other hand, in the stacked via not-forming region B, the wiring layer 25 is formed on the insulating layer 35 and connected to the wiring layer 24 through the via conductor VC in the via hole VH2.

Further, in the entire region of the stacked via forming regions A and the stacked via not-forming regions B, the insulating layer 36 is formed on the insulating layer 35. In the stacked via forming region A, the insulating layer 36 includes the opening portion 36a in the area containing the first electrode pad P1.

The size of the opening portion 36a of the insulating layer 36 is set larger than the size of the first electrode pad P1, and a space is provided between the side face of the first electrode pad P1 and the side wall of the opening portion 36a of the insulating layer 36. By this matter, it is in a state that the upper face and the side face of the first electrode pad P1 in the stacked via forming region A are exposed from the insulating layer 36.

In the example of FIG. 10, the thickness of the first electrode pad P1 in the stacked via forming region A is set thinner than the thickness of the insulating layer 36.

Moreover, in the stacked via cot-forming region B, the insulating layer 36 includes the via holes VH3 arranged on the connection parts of the wiring layer 25. Furthermore, the second electrode pad P2 is formed on the insulating layer 36 and connected, to the wiring layer 25 through the via conductor PC in the via hole VH3.

In this way, in the stacked via forming region A, the fine stacked via structure is formed in which the via pad VP and the first electrode pad P1 are stacked on the wiring layer 23 of the base wiring substrate 5.

On the other hand, in the stacked via not-forming region B, a multi-layer wiring having the non-stacked via structure is formed in which the wiring layer 24, the wiring layer 25, and the second electrode pad P2 are stacked on the wiring layer 23 of the base wiring substrate 5.

As explained in the preliminary matter above, in a case of using a conventional wiring forming method, the stack number of the wirings is the same between the stacked via forming region A and the stacked via not-forming region B. For this reason, the stack number of a fine stacked via structure increases, thus when the thermal stress or the like is generated, the via destruction is generated easily at the lowermost part of the stacked via structure.

In this embodiment, when the multi-layer wirings of the three-layers are formed on the wiring layer 23 of the base wiring substrate 5, in the stacked via forming region A, the via pad of the second-layer is omitted, and the first electrode pad P1 to be connected to the semiconductor chip is arranged at the second-layer, thereby the stacked via structure of the two-layer is constituted.

By this matter, the second electrode pad P2 in the stacked via not-forming region B is arranged on the uppermost insulating layer 36, and the first electrode pad P1 in the stacked via forming region A is arranged on the insulating layer 35 which is located to a position lower by one layer than the uppermost insulating layer 36.

In this way, the stack number of the stacked via structure is reduced rather than the stack number of the original stacked via structure. By this matter, even if the thermal stress or the like us generated, the stress which concentrates in the stacked via structure can be relaxed.

Moreover, the first electrode pad P1 in the stacked via forming region A is arranged in the opening portion 36a of the insulating layer 36 of the third-layer such that the upper face and the side face of the first electrode pad P1 are exposed. By this matter, even if the first electrode pad P1 in the stacked via forming region A and the second electrode pad P2 in the stacked via not-forming region B are arranged at different height levels, they are arranged as the same pad shape in which the upper face and side face thereof are exposed from the insulating layer 36.

Also, the wiring layer 25 in the stacked via not-forming region B and the insulating layer 36 formed thereon are each formed of a thin film having a thickness of preferably 2 μm to 3 μm. By this matter, the level difference between the first electrode pad P1 in the stacked via forming region A and the second electrode pad P2 in the stacked via not-forming region B is minimized to the utmost.

Accordingly, when the bump electrodes of a semiconductor chip are connected to the first electrode pads P1 and the second electrode pads P2 through the solder layer, the level difference can be absorbed with the same amount of the solder, thus, reliable connection can be achieved.

FIG. 11 depicts a wiring substrate 1a of a modification of the embodiment. In the wiring substrate 1a of the modification in FIG. 11, the thickness of the first electrode pads P1 in the stacked via forming regions A is set thicker than the thickness of the insulating layer 36, and the first electrode pads P1 are formed to protrude upward from the upper face of the insulating layer 36.

Moreover, the thickness of the second electrode pads P2 in the stacked via not-forming regions B is set thick corresponding to the thickness of the first electrode pads P1. The other elements in FIG. 11 are the same as those in FIG. 10.

The thickness of each of the first electrode pads P1 and the second electrode pads P2 of the wiring substrate 1a is set preferably to 10 μm or more, and thickness of an upper limit is 20 μm, for example.

When the bump electrodes of a semiconductor chip are flip-chip connected to the first and second electrode pads (copper) P1, P2 through the solder layer, an alloy layer of solder and copper is formed. In the case that the thickness of each of the first and second electrode pads P1, P2 is 2 μm to 3 μm, the entire part of the electrode pad P1, P2 almost becomes the solder-copper alloy layer.

The solder-copper alloy layer is hard and easily cracked, and tends to have high contact resistance. Therefore, by making the first and second electrode pads P1, P2 sufficiently thick, even if the alloy layer is formed, the main part can be formed of copper.

Figure 12:
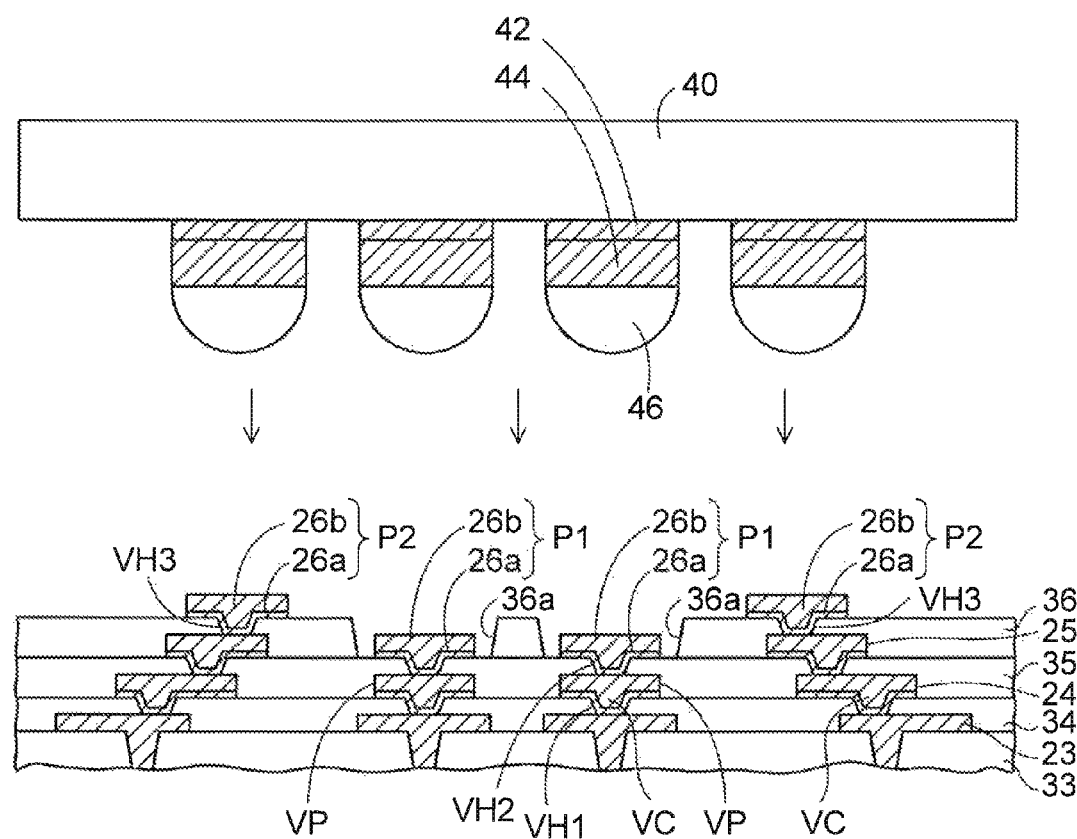
FIG. 12 is a cross-sectional view depicting a state that a semiconductor chip is flip-chip connected to the wiring substrate in FIG. 10.

Next, a method of flip-chip connecting a semiconductor chip to the wiring substrate 1 in FIG. 10 will be explained. First, as depicted in FIG. 12, a semiconductor chip 40 is prepared. The semiconductor chip 40 includes connections pads 42 formed on an element forming face, and bump electrodes 44 provided to stand on the connections pads 42.

A solder layer 46 formed by electroplating or printing is formed at the sip of each bump electrode 44 of the semiconductor chip 40. The thickness of the solder layer 46 is about 25 μm to 30 μm, for example.

The bump electrodes 44 of the semiconductor chip 40 are arrayed so as to correspond to the first electrode pads P1 and the second electrode pads P2 of the wiring substrate 1 in FIG. 10.

Figure 13:
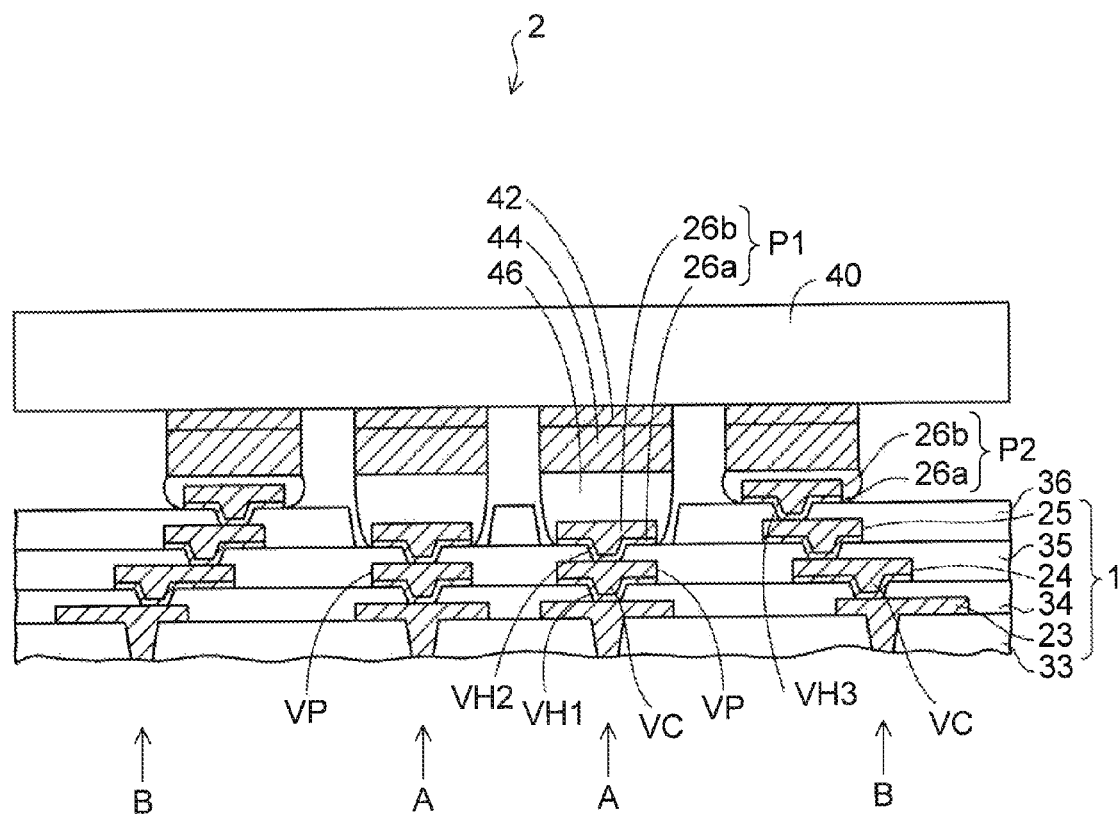
FIG. 13 is a cross-sectional view depicting a semiconductor device of the embodiment (part 1).

Then, referring to FIG. 13 in addition to FIG. 12, the bump electrodes 44 of the semiconductor chip 40 are pressed against the first electrode pads P1 and the second electrode pads P2 of the wiring substrate 1, and reflow heating is performed to melt the solder layer 24.

By this matter, the bump electrodes 44 of the semiconductor chip 40 are flip-chip connected to the first electrode pads P1 and the second electrode pads P2 of the wiring substrate 1 through the solder layer 46.

Here, as mentioned above, even if the thermal stress is generated by the heat process, since the stack number of fine stacked vias is reduced rather than the stack number of the original stacked via structure, the stress which concentrates at the lowermost part of the stacked via structure is relaxed.

By this matter, the via destruction in the stacked via structure can be prevented, and therefore the manufacturing yield can be improved. In addition, the reliability of the electrical connection between the semiconductor chip 40 and the wiring substrate 1 can be improved.

Moreover, in this embodiment, since the stack number of stacked vias is reduced, the first electrode pad P1 in the stacked via forming region A is arranged at the position under by one step than the second electrode pad P2 in the stacked via not-forming region B. However, since the wiring layer 25 formed to a lateral direction of the first electrode pad P1 in the stacked via forming region A and the insulating layer 36 on the wiring layer 25 can be formed from a thin film, the structure in which the level difference is minimized to the utmost can be obtained.

Accordingly, the level difference can be sufficiently absorbed wish the solder layer 46 formed in the same amount on each of the bump electrodes 44 of the semiconductor chip 40. Therefore, the bump electrodes 44 of the semiconductor chip 40 can be connected reliably to the first electrode pads P1 and the second electrode pads P2 of the wiring substrate 1.

Moreover, the first electrode pads P1 and the second electrode pads P2 of the wiring substrate 1 are formed in the same pad shape in which the upper face and side face are exposed. Therefore, the bonding area with the solder layer 46 can be ensured sufficiently, thus the reliable connection can be obtained.

By the above steps, a semiconductor device 2 is manufactured in which the bump electrodes 44 of the semiconductor chip 40 are flip-chip connected to the first electrode pads P1 and the second electrode pads P2 of the wiring substrate 1 in FIG. 10 through the solder layer 46. An underfill resin may be filled between the wiring substrate 1 and the semiconductor chip 40.

Figure 14:
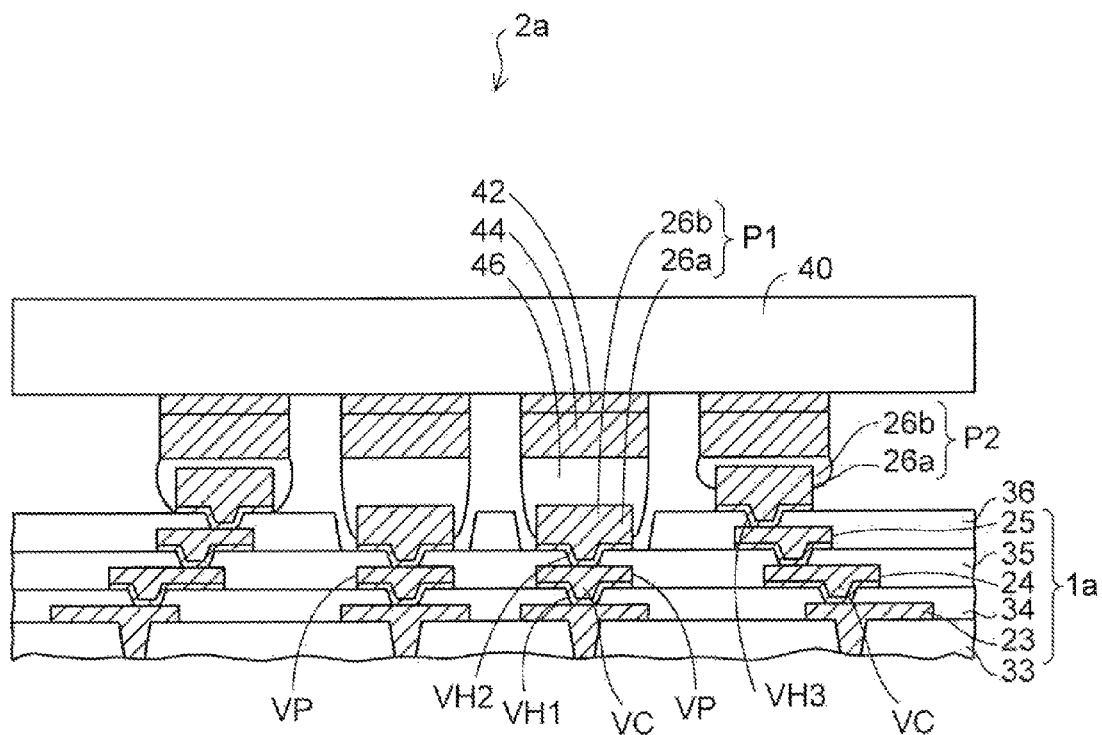
FIG. 14 is a cross-sectional view depicting a semiconductor device of the embodiment (part 2).

FIG. 14 depicts a semiconductor device 2a in which the bump electrodes 44 of the semiconductor chip 40 are flip-chip connected to the first electrode pads P1 and the second electrode pads P2 of the wiring substrate 1a in FIG. 11 through the solder layer 46.

In the semiconductor device 2a in FIG. 14, as mentioned above, the thickness of each of the first electrode pads P1 and the second electrode pads P2 of the wiring substrate 1a is set to 10 μm or more. For this reason, even if the copper-solder alloy layer is formed between each of the first and second electrode pads (copper) P1, P2, and the solder layer 46, since the main parts of the first and second electrode pads (copper) P1, P2 are formed of copper, the reliability of the electrical connection can be improved.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and interiority of the invention. Although the embodiments of the present invention have been described in detail, it should be understood that the various changes, substitutions, and alterations could be made hereto without departing from the spirit and scope of the invention.

Further, the clauses are disclosed about the above embodiment hereinafter.

(Clause 1) A method of manufacturing a wiring substrate, comprising:
  arranging a via pad on a first insulating layer in a stacked via forming region and arranging a first wiring layer on the first insulating layer in a stacked via not-forming region;
  forming a second insulating layer on the first insulating layer, the second insulating layer in which a first via hole is arranged on the via pad and a second via hole is arranged on the first wiring layer;
  forming a second wiring layer connected to the first wiring layer through the second via hole, in a state that the via pad is exposed in the first via hole;
  forming a third insulating layer on the second insulating layer, the third insulating layer in which a first opening portion is arranged in an area containing the first via hole, and a third via hole is arranged on the second wiring layer; and
  forming a first electrode pad connected to the via pad through the first via hole, on the second insulating layer in the first opening portion of the third insulating layer such that an upper face and a side face of the first electrode pad are exposed, and also forming a second electrode pad connected to the second wiring layer through the third via hole on the third insulating layer.

(Clause 2) The method of manufacturing a wiring substrate according to Clause 1, wherein the forming of the first electrode pad and the second electrode pad includes,
  forming a seed layer on the third insulating layer and on respective inner faces of the first via hole, the first opening portion, and the third via hole;
  forming a plating resist layer in which a second opening portion smaller than the first opening portion of the third insulating layer is arranged in the first opening portion so as to be communicated with the first via hole, and a third opening portion is arranged in an area containing the third via hole;
  forming a metal plating layer in the second opening portion and the third opening portion of the plating resist layer by electroplating;
  removing the plating resist layer; and
  etching the seed layer while using the metal plating layer as a mask.

(Clause 3) The method of manufacturing a wiring substrate according to Clause 1, wherein
  an upper face and a side face of the second electrode pad are exposed from the third insulating layer, and
  the first electrode pad on a the second electrode pad have the same pad shape.

(Clause 4) The method of manufacturing a wiring substrate according to Clause 1, wherein in the forming of the third insulating layer, the third insulating layer is formed of a photosensitive resin containing no filler.

(Clause 5) A method of manufacturing a semiconductor device, comprising:
  obtaining a wiring substrate by a method including
    arranging a via pad on a first insulating layer in a stacked via forming region and arranging a first wiring layer on the first insulating layer in a stacked via not-forming region,
    forming a second insulating layer on the first insulating layer, the second insulating layer in which a first via hole is arranged on the via pad and a second via hole is arranged on the first wiring layer,
    forming a second wiring layer connected, to the first wiring layer through the second via hole, in a state that the via pad is exposed in the first via hole,
    forming a third insulating layer on the second insulating layer, the third insulating layer in which a first opening portion is arranged in an area containing the first via hole, and a third via hole is arranged on the second wiring layer, and
    forming a first electrode pad connected to the via pad through the first via hole, on the second insulating layer in the first opening portion of the third insulating layer such that an upper face and a side face of the first electrode pad are exposed, and also forming a second electrode pad connected to the second wiring layer through the third via hole on the third insulating layer; and
  connecting bump electrodes of a semiconductor chip to the first electrode pad and the second electrode pad of the wiring substrate through a solder layer.

What is claimed is:

1. A wiring substrate, comprising:
   a first multi-layer wiring layer having a stacked via structure including a first electrode pad, the stacked via structure including a via conductor having a tapered shape in which an upper diameter is larger than a lower diameter is stacked in a vertical direction;
   a second multi-layer wiring layer having a non-stacked via structure including a second electrode pad, wherein, the second electrode pad is formed on an uppermost first insulating layer, and an upper face and a side face of the second electrode pad are exposed from the first insulating layer;
   the first electrode pad is formed on a second insulating layer which is located to a position lower by one layer than the first insulating layer,
   and the first electrode pad is arranged in an opening portion of the first insulating layer and an upper face and a side face of the first electrode pad are exposed from the first insulating layer and the second insulating layer, and
   a solder is to be connected to the upper face and side face of first electrode pad and the upper face and side face of the second electrode pad.

2. The wiring substrate according to claim 1, wherein
   an upper face and a side face of the second electrode pad are exposed from the first insulating layer, and
   the first electrode pad and the second electrode pad have the same pad shape.

3. The wiring substrate according to claim 1, wherein the first insulating layer is formed of a photosensitive resin containing no filler.

4. A semiconductor device, comprising:
   a wiring substrate which includes
     a first multi-layer wiring layer having a stacked via structure including a first electrode pad, the stacked via structure including a via conductor having a tapered shape in which an upper diameter is larger than a lower diameter is stacked in a vertical direction;
     a second multi-layer wiring layer having a non-stacked via structure including a second electrode pad, wherein, the second electrode pad is formed on an uppermost first insulating layer, and an upper face and a side face of the second electrode pad are exposed from the first insulating layer,
   the first electrode pad is formed on a second insulating layer which is located to a position lower by one layer than the first insulating layer,
   and the first electrode pad is arranged in an opening portion of the first insulating layer, and an upper face and a side face of the first electrode pad are exposed from the first insulating layer and the second insulating layer; and a semiconductor chip mounted on the wiring substrate, wherein bump electrodes of semiconductor chip are connected to an upper face and a side face of the first electrode pad and an upper face and a side face of the second electrode pad of the wiring substrate through a solder.

\* \* \* \* \*